(12) United States Patent
Thoren

(10) Patent No.: US 7,447,803 B2
(45) Date of Patent: Nov. 4, 2008

(54) METHOD AND DEVICE FOR REDUCING A DATASET CONSISTING OF PROCESS DATA TO BE TRANSMITTED

(75) Inventor: Werner Thoren, Steinen (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 86 days.

(21) Appl. No.: 10/506,828

(22) PCT Filed: Feb. 26, 2003

(86) PCT No.: PCT/EP03/01956

§ 371 (c)(1),
(2), (4) Date: Jun. 27, 2005

(87) PCT Pub. No.: WO03/075466

PCT Pub. Date: Sep. 12, 2003

(65) Prior Publication Data

US 2006/0053218 A1   Mar. 9, 2006

(30) Foreign Application Priority Data

Mar. 6, 2002   (DE) ................................ 102 09 734

(51) Int. Cl.
*G06F 15/16* (2006.01)
*G06F 13/36* (2006.01)
*G06F 11/00* (2006.01)

(52) U.S. Cl. ................ 709/247; 709/246; 710/309; 714/46

(58) Field of Classification Search ................ None
See application file for complete search history.

(56) References Cited

U.S. PATENT DOCUMENTS

| | | | |
|---|---|---|---|
| 5,388,252 A * | 2/1995 | Dreste et al. | 714/46 |
| 6,215,907 B1 | 4/2001 | Kumar et al. | |
| 6,968,396 B1 * | 11/2005 | Schillings et al. | 709/246 |
| 2005/0080850 A1 * | 4/2005 | Salesky et al. | 709/204 |

FOREIGN PATENT DOCUMENTS

| | | |
|---|---|---|
| EP | 0 708 389 B1 | 4/1999 |
| EP | 0 964 325 A1 | 12/1999 |

* cited by examiner

*Primary Examiner*—Wen-Tai Lin
(74) *Attorney, Agent, or Firm*—Bacon & Thomas, PLLC

(57) ABSTRACT

A method for reducing an amount of process data to be transferred from a field device, wherein the process data includes information concerning an operating condition of the field device, and/or information concerning process variables registered with the field device, and/or identification data of the field device. It is provided that process data occurring during an interval between two transfers of data is evaluated and stored, wherein the process data are reduced through the evaluating, and wherein the reduced process data is transferred to a process control station.

7 Claims, 2 Drawing Sheets

METHOD AND DEVICE FOR REDUCING A DATASET CONSISTING OF PROCESS DATA TO BE TRANSMITTED

FIELD OF THE INVENTION

The invention relates to a method for reducing an amount of process data to be transferred from a field device, wherein the process data include information concerning the operating condition of the field device, and/or information concerning process variable registered with the field device, and/or identification data of the field device.

BACKGROUND OF THE INVENTION

In the field of automation technology, field devices presently are used which register and/or influence process variables. Examples of such field devices for registering process variables are fill level measuring devices, mass-flow meters, pressure meters, temperature meters, etc., which register the corresponding process variables fill level, mass flow rate, pressure, and temperature, respectively. Examples of field devices for influencing process variables are so-called "actors," or actuators, which control e.g., as valves, the flow rate of a liquid in a section of piping, or, as pumps, the fill level of a medium in a container.

The field devices are connected via corresponding communications connections, normally via a data bus, with a process control center, which controls the entire course of the process, or which enables direct access to the individual field devices for operating, parameterizing, or configuring. By means of the direct access, settings (e.g. parameters) at the field device can be changed, or special diagnostic functions can be called-up. In addition to access via the process control center, temporary access, e.g. by means of a handheld device, portable computer, or cellular phone is possible.

In order to enable the operation of various field devices from the process control center, the functionality of a field device must be known to the process control center. The functionality of a field device is normally described using a device description. For this, special standardized device description languages are available; examples are CAN—EDS (Control Area Network—Electronic Data Sheet), Hart—DDL (Hart—Device Description Language), FF—DDL (Fieldbus Foundation—Device Description Language), Profibus—GSD (Profibus—Gerätestammdaten (Device Master Data)), Profibus—EDD (Profibus—Electronic Device Description). From the process control center, the operation of the field device is accomplished mostly by means of a graphical user interface, which facilitates start-up, maintenance, data protection, troubleshooting, and device documentation.

In the process control center, the measured values of the different process variables are evaluated or monitored, as the case may be, and the corresponding actuators are activated.

The transfer of data between the field device and the process control center is accomplished with wires, or wirelessly, in accordance with one of the known international standards for field busses, such as e.g. Hart, Foundation Fieldbus, Profibus, CAN, etc., or, for remotely arranged components of an installation, via public communication networks.

In the case of a process controlled from the process control center, which process is divided among several locations and includes a number of field devices, the amount of data to be transferred can lead to an overloading of the data bus system, or the public networks can be occupied too long, as the case may be.

SUMMARY OF THE INVENTION

An object of the invention therefore is to provide a method and an apparatus for reducing an amount of process data to be transferred.

This object is achieved according to the invention, in that the process data occurring during an interval between two transfers of data is evaluated and stored, wherein the process data are reduced by means of the evaluating, and wherein the reduced process data are transferred to a process control.

A main idea of the invention is that the process data occurring in an interval between two transfers of data is stored and evaluated, with the evaluated process data being transferred to a process control center. The process data includes information concerning the operating conditions of the field devices, and/or information concerning the process variables which are registered with the field devices, and/or identification data of the respective field devices. Under the term "field device," actuators for influencing the process variables are also understood.

A reduction of the process data to be transferred is achieved by the evaluating of the process data. In the evaluating, the process data are divided into static and dynamic data. All process data which have changed since the last executed evaluation are classified as dynamic data. All process data which have not changed since the last evaluation are classified as static data and are transferred as binary state-values, with the process control center recognizing from the transferred state-value that no change of the belonging process parameter is present.

Typical dynamic data are, for example, the measured values of the process variables monitored with the field devices, such as fill level, mass flow rate, pressure, and temperature. Typical static data, which do not change over a longer period of time, are, for example, the current state of the device (everything in order, or an error code, as the case may be), the type of the monitored parameter, and/or the physical units of the acquired measured value. At the start-up of the installation, all process data is transferred once unevaluated to the process control center. Subsequently, the process data are evaluated before the transfer, and the static data is transferred only as binary state values. Thus, the amount of process data to be transferred can advantageously be reduced, in that only the dynamic data must be transferred as a detailed data word.

A further reduction of the static data is achieved in a further development of the invention, in that specific static data, such as, for example, the type of the monitored process variables and/or the physical unit of the measured value to be acquired, are stored in a device description file. The process control center has direct access to this device description file, such that the corresponding data need not be transferred from the field device to the process control center.

An additional reduction of the process data to be transferred is advantageously achieved, in that the number of data transfers is reduced. For this purpose, the transfer of the reduced process data is made dependent on the occurrence of specified conditions.

The amount of data to be transferred can be further reduced when, in the transfer of the dynamic data, only the difference between the current value and the old value of a process variable is transferred. To avoid error propagations, it can advantageously be provided that the current values of the process variables are transferred regularly, for example once a day, or after a specifiable number of transfers.

A further possibility for reducing the data to be transferred is to determine in the evaluating whether the acquired values of the affected process variables lie within a specified value range. The range limits can, in an advantageous development, likewise be specified by the user. For the transfer, the ranges are coded, and only the code for the affected range, in which the acquired measured value lies, is transferred to the process control center. By this measure, the dynamic data can advantageously be transformed into static data by intelligent definition of the ranges, and thus the amount of data to be transferred is further reduced.

In an especially advantageous embodiment of the invention, specifications for the evaluating of the process data and/or for executing the transfer of the reduced process data can be influenced by a user.

In an advantageous embodiment of the invention, the specified conditions for actuating a data transfer include as specifications, for example, a specific time span and/or a specified time on the clock. Furthermore, the specifications can also include the occurrence of specific events, such as, for example, the attaining and/or exceeding of specified threshold values or alarm criteria. In this way, the number of data transfers, and consequently the amount of data, is reduced.

Through the reduction of the amount of data to be transferred, especially the costs for the use of the telephone networks (conventional telephone network or radio network, as the case may be) are lowered.

In an advantageous further development of the method, for a field device, all possible specifications which can be influenced by the user are stored in an individual device description file belonging to the field device. The device description file describes, furthermore, the functionality of the belonging field device, and also includes, for example, information concerning the process variables which can be acquired and/or influenced with the field device, and includes, also for example, information which is otherwise transferred from the field device to the process control center as static data. An individual device description file is matched to its field device by means of the identification data.

The transfer of data between the field device and the process control center is accomplished using a local data bus and/or a remote connection.

In an especially advantageous embodiment of the invention, the Internet is used as communication platform between the field device and the process control station.

In a further embodiment of the invention, the transfer of data between the field device and the process control center is unidirectional, with a bidirectional communication then being implemented when data from the process control center must be transferred to the field device.

This measure is particularly important for locations where the field device is normally switched off in order to save energy, for example in large, isolated repositories, or deposits, and is activated only when specified conditions exist, for example at the expiration of a specific time span, or at a specific time on the clock. After the activation, the field device acquires the process data, which is subsequently evaluated, stored, and transferred to the process control center. Subsequently the field device remains activated for a predetermined time span, and then switches itself off again after the expiration of the time span. During this time span, after receiving the process data, the process control center reviews whether new data, for example altered conditions for actuating a transfer of data, must be transferred to the field device. If no such new data is transferred from the process control center to the field device, then the field device shuts itself off after the specified time span.

For the execution of the method according the invention, an evaluation/control unit is provided, wherein the process data acquired during an interval between two transfers of data is evaluated by the evaluation/control unit and saved in a storage unit, with the storage unit possibly being a part of the evaluation/control unit, and wherein the process data to be transferred is formed by the evaluation/control unit from the evaluated process data, and is transferred to the process control center by means of suitable communications equipment. For the entering of specifiable conditions by the user, in an advantageous embodiment, suitable operating and display units are provided, which, for example, are located in the process control center.

In another advantageous embodiment of the invention, the evaluation/control unit and the storage unit are implemented as a part of the field device.

The invention will now be explained in greater detail on the basis of an example of an embodiment illustrated in the drawings, whose figures show as follows:

DESCRIPTION OF THE PREFERRED EMBODIMENT

Figure 1:
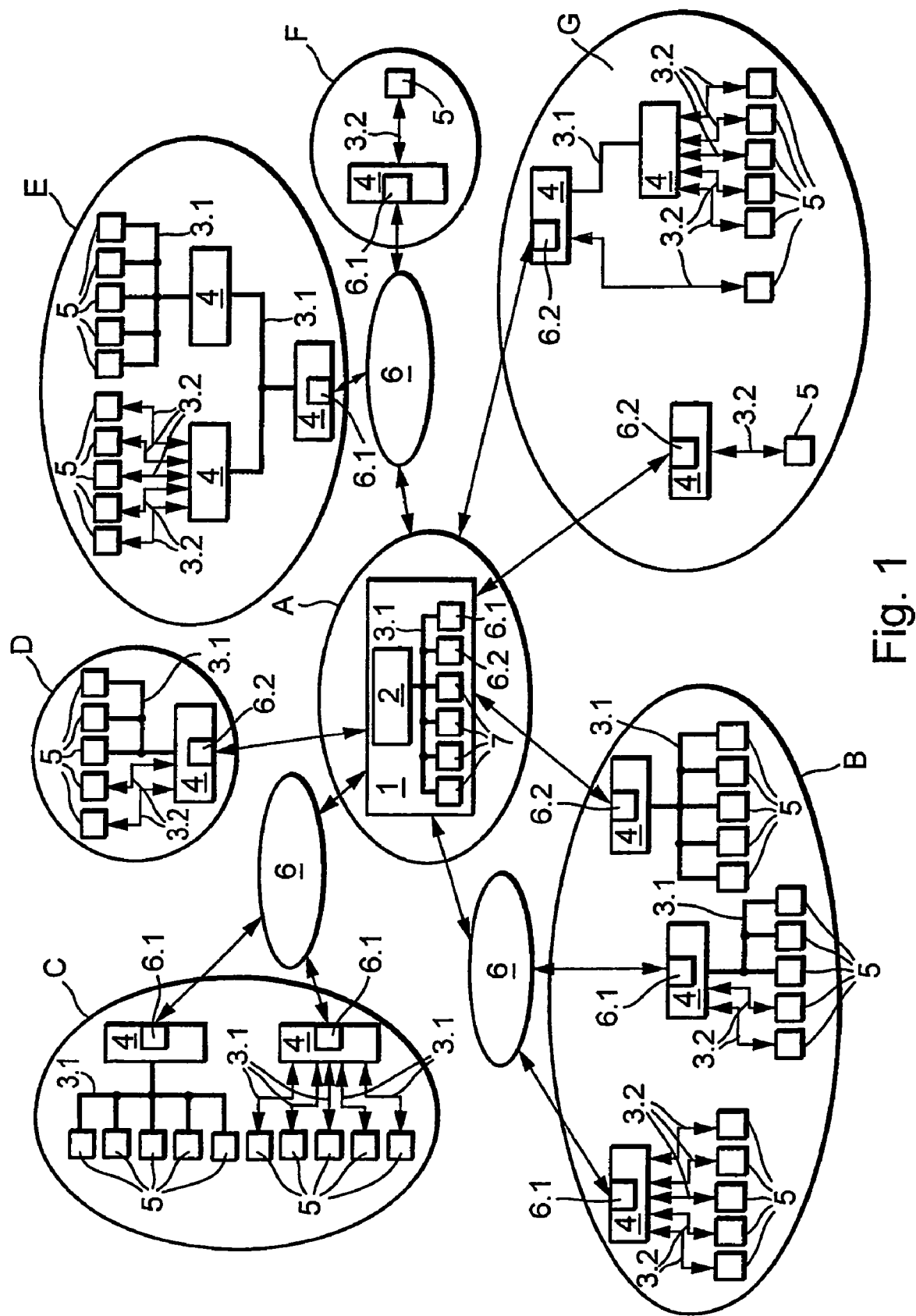
FIG. 1 is a schematic illustration of a distributed automation installation.

As is apparent from FIG. 1, the illustrated automation installation is distributed among seven locations A, B, C, D, E, F, G. At the individual locations, sub-processes are running which are part of an overall process involving all locations, for example a storage monitoring or storage optimization process, or a production monitoring or production optimization process. The sub-processes can be operating and/or display processes, and/or control and/or regulating processes, and/or communication processes, and/or storage processes, and/or processes for measuring and/or acquiring process variables, and/or processes for influencing process variables.

As is further apparent from FIG. 1, present at the location A is a process control center 1 with at least one processor 2, a first interface 6.1 for the transfer of data via the Internet 6, a second interface 6.2 for the transfer of data via a telephone network (conventional telephone network or radio network), and multiple operating and display units 7, with which the user can supply specifications for the reduction of the process data to be transferred. In the illustrated example of the embodiment, the individual units communicate with each other via a local data bus 3.1. At the other locations B, C, D, E, F, G, present are at least one field device 5, at least one evaluation/control unit 4, and at least one interface 6.1, 6.2 for communicating with the process control center 1, with the interface being implementable as interface 6.1 for the transfer of data via the Internet 6, and/or as interface 6.2 for the transfer of data via a telephone network. The illustrated locations exemplify different possibilities of how the process parameters acquired or influenced with the field devices 5 get to the process control center 1. Thus, at location B, for example, three groups of field devices 5 are illustrated, with, in each case, five field devices 5 being connected with an evaluation/control unit 4, with a first group being connected with the belonging evaluation/control unit 4 via a local data bus 3.1, with a second group of field devices 5 being connected with the belonging evaluation/control unit 4 via individual data lines 3.2, and with a third group of field devices 5 having three field devices 5 connected with the belonging evaluation/control unit 4 via a local data bus 3.1, and two field devices connected with the belonging evaluation/control unit 4 via individual data lines 3.2. At location B, for the exchange of data with the process control center 1, two evaluation/control units 4 are equipped with an interface 6.1 for the transfer of data via the Internet 6, and one evaluation/control unit 4 is equipped with a second interface 6.2 for the transfer of data via a telephone network.

However, it is also conceivable, as the illustration of location F shows, that at a location only one field device 5, with an evaluation/control unit 4 and corresponding interface 6.1, is present.

Furthermore the illustration of the location E shows that not every evaluation/control unit 4 must be equipped with its own interface 6.1, 6.2 for the transfer of data with the process control center 1. Rather, the possibility also exists that multiple field devices 5 are arranged in groups, and each group is assigned to an evaluation/control unit 4, with a further evaluation/control unit 4 being present, which is equipped with an interface 6.1 for the exchange of data with the process control center 1.

In the illustrated example of an embodiment, though all evaluation/control units 4 are implemented as independent units, it is, nevertheless, basically possible that the evaluation/control unit be part of a field device 5. This also applies to the illustrated interfaces 6.1, 6.2 for the exchange of data with the process control center 1.

Figure 2:
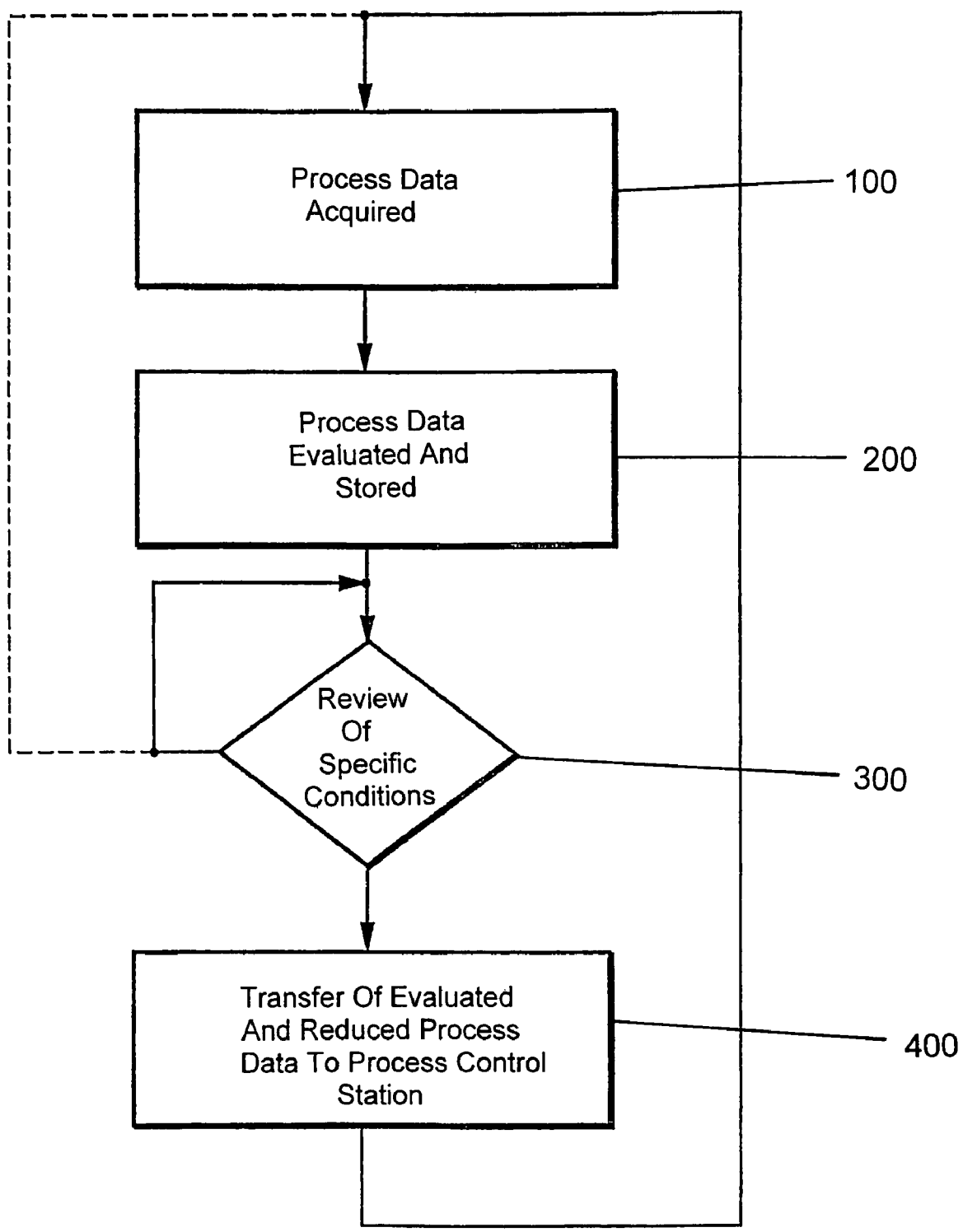
FIG. 2 is a schematic illustration of a flow diagram of the method according to the invention.

As is apparent from FIG. 2, in a first step 100 of the method, the process data are acquired. Subsequently, in a second step 200 of the method, the process data are evaluated and stored, wherein after the evaluating, a reduced amount of process data to be transferred is present. In a third step 300 of the method, it is reviewed whether certain specified conditions are present, for example, expiration of a specified time span, or presence of an alarm criterion, or attaining of a specific threshold value, or a specific time on the clock. If the specifications are met, then, in a fourth step 400 of the method, the evaluated and reduced process data are transferred to the process control station. If the specifications are not met, then dependent on the process, either there is a jump back to step 100 of the method (illustrated by the dashed line), or step 300 of the method is repeated until the specifications are met. After the fourth step 400 of the method, the method starts again from the beginning with the first step 100 of the method.

In a further (not-illustrated) embodiment of the invention, especially when the specified conditions for the transfer of the process data do not depend on the process variables to be acquired, but rather, for example, on a specified time on the clock or time span, the step 300 of the method is first executed, and it is reviewed whether the specified conditions are met or not, and then, if the conditions are met, the process data are acquired in the step 100 of the method, evaluated and stored in the step 200 of the method, and then transferred to the process control station in the step 400 of the method. After the step 400 of the method, in this embodiment there is a jump back to the step 300 of the method, and the method starts again from the beginning.

The invention claimed is:

1. A method for reducing a process data set to be transferred from a field device for registering and/or influencing process variables to a process control center, via a databus in the process automation, the process data including information concerning the operating condition of the field device, and/or information concerning process variables registered with the field device, and/or identification data of the field device, comprising the steps of evaluating and storing the process data occurring during an interval between two transfers of data, wherein the process data are reduced by means of the evaluation;

transferring the reduced process data to a process control center; and dividing the process data in the evaluation into static and dynamic data, wherein:

process data which have changed since the last executed evaluation are classified as dynamic data, each static data are transferred as binary state values, transfer of the reduced process data is executed only at the occurrence of specified conditions, for the dynamic data, coded ranges are specified, and only the code of the affected range, in which a process parameter is contained, is transferred to the process control center.

2. The method as claimed in claim 1, further comprising the step of:

forming from the dynamic data, a data word to be transferred, wherein:

the data word represents the altered value of a process parameter, or the difference between the new value and the old value of the process parameter.

3. The method as claimed in claim 1, wherein:

specifications for the evaluation of the process data, and/or for the execution of the transfer of the reduced process data, can be influenced by a user.

4. The method as claimed in claim 3, wherein:

specifications for the transfer of the reduced process data include a predetermined time span, and/or a specified time on the clock, and/or the occurrence of specified events.

5. The method as claimed in claim 1, wherein:

an individual device description file is assigned to the field device by means of the identification data; and information concerning the field device is read out of a data description file.

6. The method as claimed in claim 1, wherein:

the Internet is used as communication platform between the field device and a process control station.

7. The method as claimed in claim 1, wherein:

the transfer of data between the field device and a process control station is unidirectional; and a bidirectional communication is then implemented when data from the process control station must be transferred to the field device.

* * * * *